(12) United States Patent
Takeda et al.

(10) Patent No.: US 6,346,464 B1
(45) Date of Patent: Feb. 12, 2002

(54) MANUFACTURING METHOD OF SEMICONDUCTOR DEVICE

(75) Inventors: Toru Takeda, Kokubunji; Tetsujiro Tsunoda, Urawa, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/604,100

(22) Filed: Jun. 27, 2000

(30) Foreign Application Priority Data

Jun. 28, 1999 (JP) ............................................. 11-181687

(51) Int. Cl.[7] .......................................... H01L 21/425
(52) U.S. Cl. ...................... 438/514; 438/268; 438/184; 438/228; 438/451
(58) Field of Search ................................ 438/514, 268, 438/184, 270, 299, 302, 303, 305, 348, 366, 639, 210, 217, 228, 451

(56) References Cited

U.S. PATENT DOCUMENTS

| 4,472,871 A | * | 9/1984 | Green et al. | ................. 438/276 |
| 5,438,215 A | | 8/1995 | Tihanyi | |
| 6,103,578 A | * | 8/2000 | Uenishi et al. | ............. 438/268 |

FOREIGN PATENT DOCUMENTS

EP          1003272 A2  *  5/2000  ............ H02M/3/00

* cited by examiner

Primary Examiner—Matthew Smith
Assistant Examiner—Igwe U. Anya
(74) Attorney, Agent, or Firm—Oblon, Spivak, McClelland, Maier & Neustadt, P.C.

(57) ABSTRACT

A method of manufacturing a low power dissipation semiconductor power device is provided which is easy to perform and suitable for mass production. When a first and second conductivity-type regions are formed on a semiconductor substrate which is selectively irradiated by impurity ions, an excellent super junction is formed by controlling the ion acceleration energy and the width of each irradiated region so that the first and second conductivity-type regions may have a uniform impurity distribution and a uniform width along the direction of irradiation. Another method of manufacturing a low power dissipation semiconductor power device having an excellent super junction is provided which selectively irradiates a collimated neutron beam onto a $P^+$ silicon ingot and forms an $N^+$ region that has a uniform impurity distribution and a uniform width along the direction of irradiation in the $P^+$ silicon ingot.

18 Claims, 5 Drawing Sheets

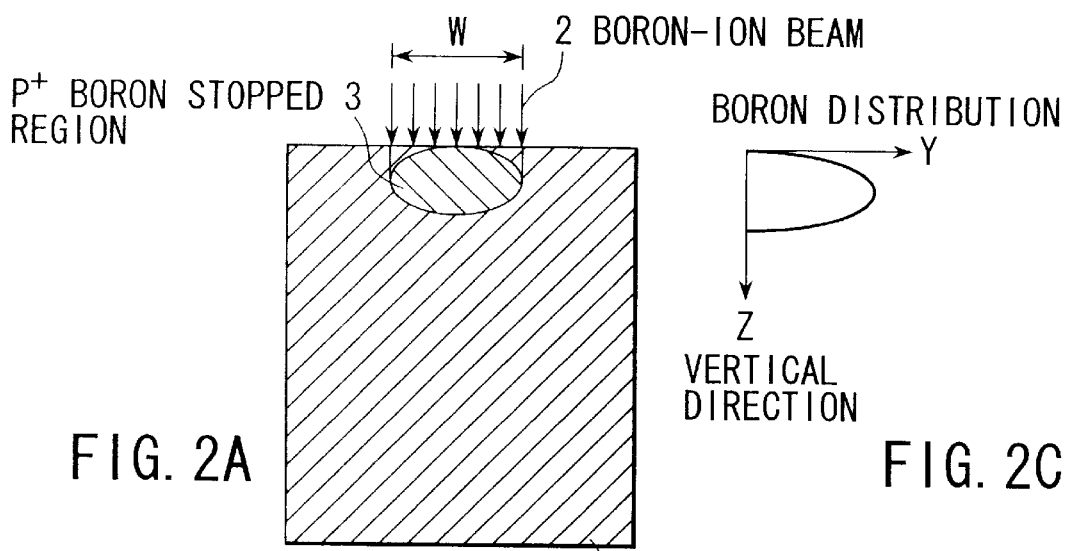
FIG. 2A
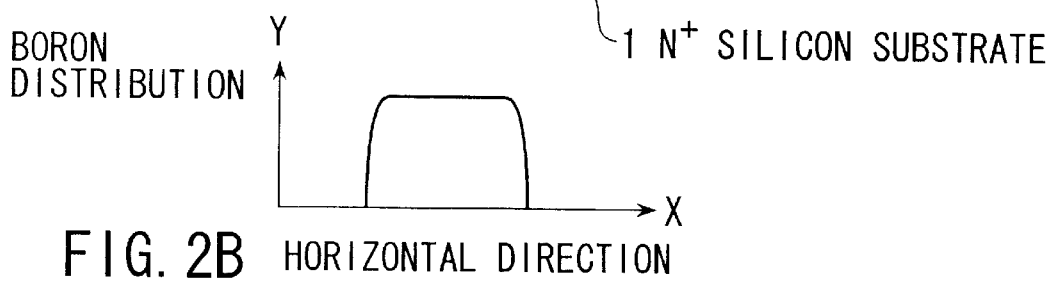
FIG. 2B
FIG. 2C
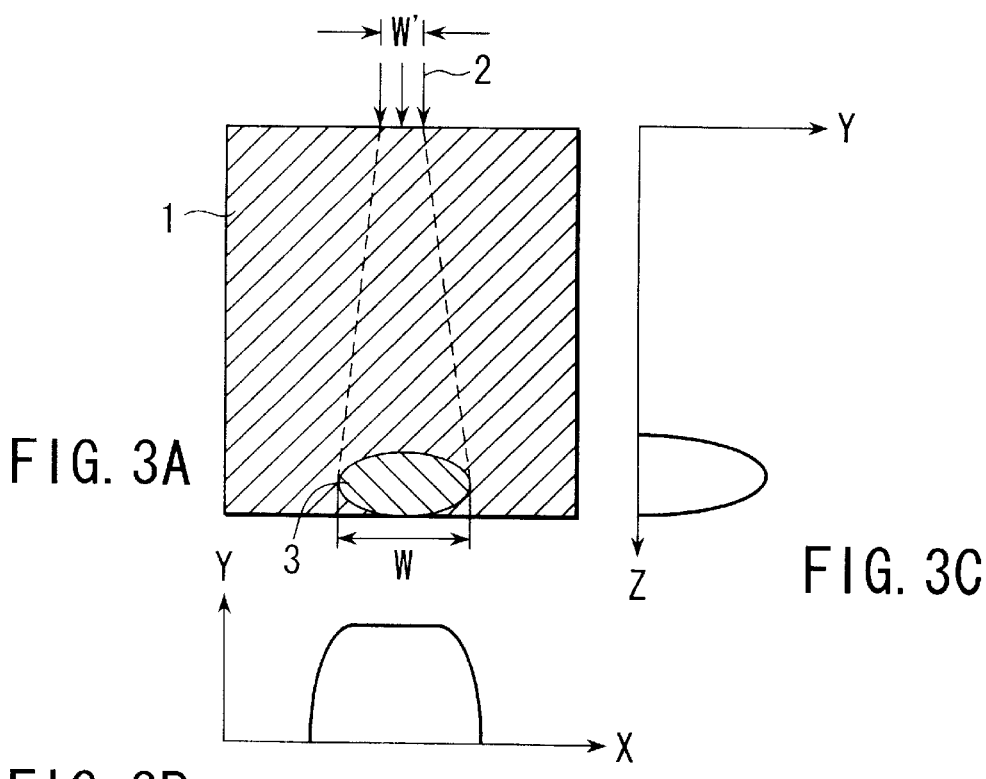
FIG. 3A
FIG. 3B
FIG. 3C

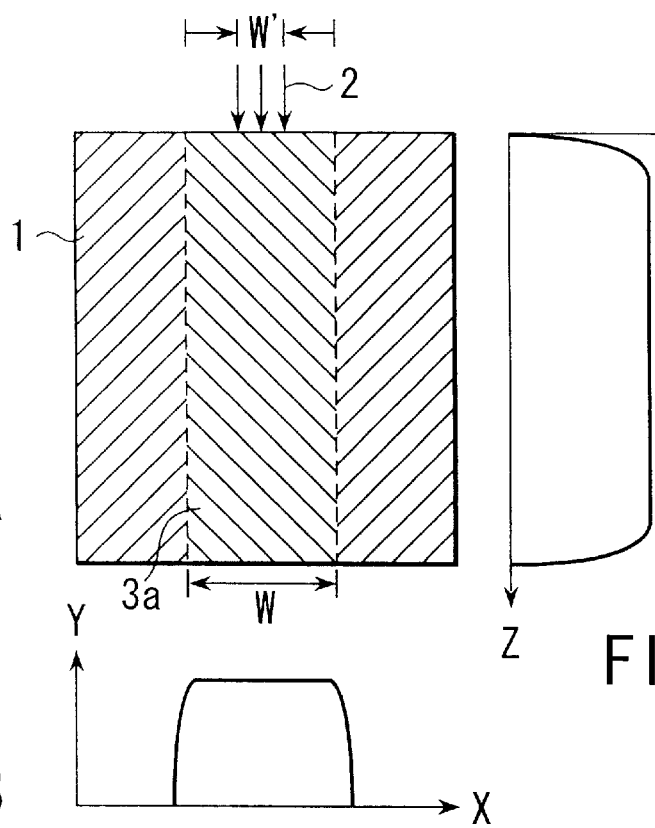
FIG. 4A
FIG. 4B
FIG. 4C
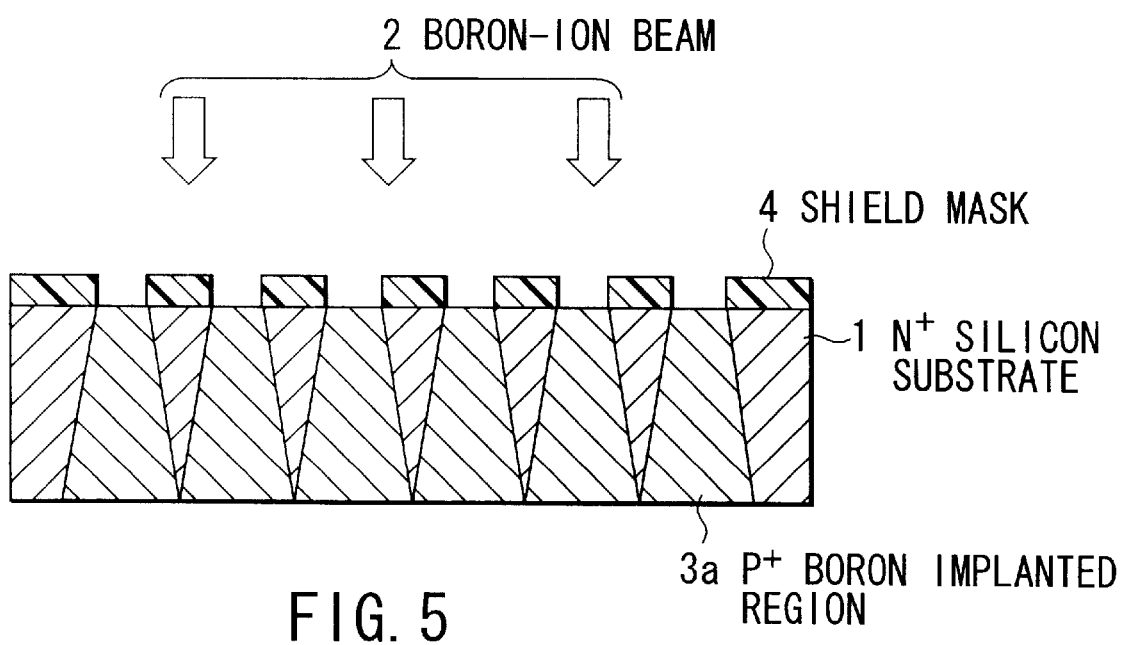
FIG. 5

MANUFACTURING METHOD OF SEMICONDUCTOR DEVICE

CROSS-REFERENCE TO RELATED APPLICATIONS

This application is based upon and claims the benefit of priority from the prior Japanese Patent Application No. 11-181687, filed Jun. 28, 1999, the entire contents of which are incorporated herein by reference.

BACKGROUND OF THE INVENTION

The present invention generally relates to a method of manufacturing semiconductor devices, and more particularly relates to a method of manufacturing low power dissipation semiconductor power devices.

Some of the low power dissipation semiconductor power devices of the prior art have a junction structure (hereafter referred to as "super junction") consisting of a vertical junction group where a first conductivity-type region and a second conductivity-type region are alternatively arranged vertically to the surface of a silicon substrate.

There is a prior method of creating such super junction structure by repeating $N^-$ epitaxial growth and ion implantation. FIG. 1 provides a brief explanation of this manufacturing process. In FIG. 1, a flow of the manufacturing process is shown in the right-hand part and cross sections of the silicon substrate at each step in the left-hand part.

As shown in FIG. 1, an $N^+$ silicon substrate 101 is prepared and on that an $N^-$ epitaxial layer 102 is grown. Then boron-ions are implanted by the use of an ion implantation mask (not shown) to form $P^+$ regions 103 in the $N^-$ epitaxial layer 102. Subsequently, by the use of an inverted mask of the ion implantation mask, phosphorous ions are implanted in a region adjacent to the $P^+$ regions 103 to form $N^+$ regions 104.

These ion-implanted regions are activated by annealing (not shown) to provide the $P^+$ regions 103 and $N^+$ regions 104. Annealing can be performed either after each ion implantation or after all the implantations have been completed. In this way, a PN junction plane is formed as part of a super junction consisting of PN junctions vertically arranged to the surface of an epitaxial layer.

Next, another $N^-$ epitaxial layer 102 is grown and, as shown in the right-hand part of FIG. 1, the steps from boron implantation to $N^-$ epitaxial growth are repeated. Then a vertical super junction is formed where PN-junction planes are alternatively created in the vertical direction to the wafer surface.

The $N^+$ silicon substrate 101, which was used at an early step, will be a drain region of the low power dissipation semiconductor power device. Since the manufacturing method to be employed in the processes after the formation of a super junction is described later in FIG. 6D, detail explanation is not given here.

If a low power dissipation semiconductor power device having this super junction structure is manufactured to which high voltages are applied, since drain junction planes are formed by $P^+$ and $N^+$ regions that extend vertically to the wafer surface and a current path is created in the $N^+$ layer in the inner bulk region of the silicon substrate, the low power dissipation semiconductor power device of NMOS-type shows a low ON resistance and a high drain withstand voltage.

A shortcoming in the above prior art is that such manufacturing method of repeating the epitaxial growth process to create low power dissipation semiconductor power devices is costly, difficult to implement and not suitable for mass production.

BRIEF SUMMARY OF THE INVENTION

The present invention has been made to solve the above problem and its principal object is to provide a method of manufacturing low power dissipation semiconductor power devices having the super junction structure.

The present invention employs not the low-yield epitaxial growth process but a method suitable for mass production by irradiating particle beams such as an ion beam and a neutron beam onto semiconductor substrates to provide low power dissipation semiconductor power devices having the super junction structure at low cost and with ease.

To be more specific, the present invention is a semiconductor device manufacturing method of forming a second conductivity-type region by irradiating impurity ions selectively onto a first conductivity-type semiconductor substrate, wherein the above impurity ion irradiated region is restricted by a shield mask that intercepts the impurity ions and the acceleration energy of impurity ions is controlled so that the impurity concentration in the second conductivity-type region may be uniform along the direction of irradiation.

The present invention is a semiconductor device manufacturing method of forming at least one of a first conductivity-type region and a second conductivity-type region in the semiconductor substrate by irradiating impurity ions selectively onto the semiconductor substrate, wherein the impurity concentration is uniform along the direction of irradiation in the first and second conductivity-type regions and the impurity ion acceleration energy and the area of irradiated region are controlled to make the cross-sectional shape and the cross-section area of each of the first and second conductivity-type regions on planes vertical to the irradiation direction uniform along the direction of irradiation.

In a preferred embodiment of the present invention, the area of irradiated region is controlled by an electric sweeping or magnetic sweeping of the impurity ion beam, or by movement of the semiconductor substrate. In the control of the ion acceleration energy and the area of the irradiated region, the area of the irradiated region is changed according to changes in the ion acceleration energy.

Further, in another preferred embodiment of the present invention, the area of the irradiated region is controlled with a shield mask intercepting the impurity ions, and the acceleration energy and the area of the irradiated region are controlled by changing the aperture area of the mask according to changes in the acceleration energy.

The present invention is a semiconductor device manufacturing method of forming a first and second conductivity-type regions by irradiating impurity ions selectively onto a semiconductor substrate; wherein two shielding masks in a reversed imaging relation to each other are used to restrict the impurity ion irradiated regions so that the cross-sectional shape and the cross-section area of the first and second conductivity-type regions on planes vertical to the irradiation direction may be uniform in the direction of irradiation; and the impurity ion acceleration energy is controlled to make the impurity concentration in the first and second conductivity-type regions uniform in the direction of irradiation.

The present invention is a semiconductor device manufacturing method of forming an $N^+$ region by selectively irradiating a neutron beam onto a $P^+$ semiconductor ingot, wherein the incident angle of the neutron beam is collimated so that the cross-sectional shape and the cross-section area of the N$^+$ region may be uniform in the direction of irradiation and so that the impurity concentration in the N$^+$ region may be uniform in the direction of irradiation.

In a preferred embodiment of the present invention, the P$^+$ ingot is made of one of silicon, germanium and silicon carbide, and the incident angle of the neutron beam is parallel to the direction of a growth axis of the P$^+$ semiconductor ingot.

The foregoing and other objects, features and advantages of the invention will become more readily apparent from the following detailed description of the present invention which proceeds with reference to the accompanying drawings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A shows a boron distribution provided by a low energy ion irradiation according to a first embodiment of the present invention;

FIG. 2B shows a boron distribution in the horizontal direction provided by a low energy ion irradiation according to a first embodiment of the present invention;

FIG. 2C shows a boron distribution in the vertical direction provided by a low energy ion irradiation according to a first embodiment of the present invention;

FIG. 3A shows a boron distribution provided by a high energy ion irradiation according to a first embodiment of the present invention;

FIG. 3B shows a boron distribution in the horizontal direction provided by a high energy ion irradiation according to a first embodiment of the present invention;

FIG. 3C shows a boron distribution in the vertical direction provided by a high energy ion irradiation according to a first embodiment of the present invention;

FIG. 4A shows a method of forming a super junction by an ion irradiation according to a first embodiment of the present invention;

FIG. 4B shows a boron distribution in the horizontal direction in a super junction provided by an ion irradiation according to a first embodiment of the present invention;

FIG. 4C shows a boron distribution in the vertical direction in a super junction provided by an ion irradiation according to a first embodiment of the present invention;

FIG. 5 shows a method of forming a super junction by the use of shield masks according to a second embodiment of the present invention;

DETAILED DESCRIPTION OF THE INVENTION

Figure 1:
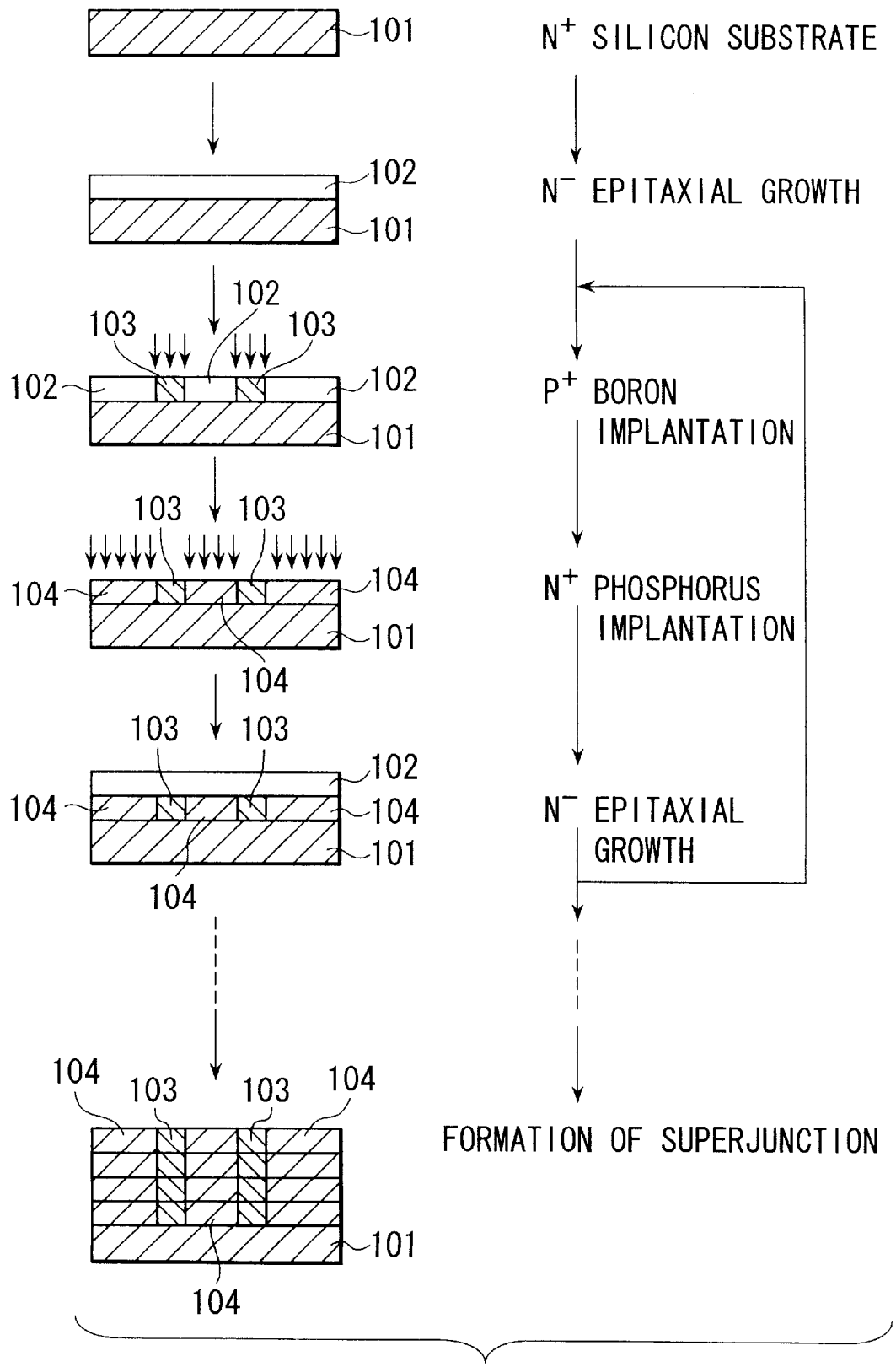
FIG. 1 shows a prior art method of forming a super junction.

Now referring in detail to the drawings, the embodiments of the present invention are explained. Referring to FIGS. 2A, 2B, 2C and FIGS. 3A, 3B, 3C, and FIGS. 4A, 4B, 4C, an example of the method forming a super junction by an ion implantation according to a first embodiment of the invention is explained.

As shown in FIG. 2A, when a low energy boron-ion beam 2 is irradiated onto an N$^+$ silicon substrate 1, the implanted boron-ions lose energy within a short projection range in the N$^+$ silicon substrate 1 and then form a boron stopped region 3 near the surface.

The boron distributions in a horizontal direction along the surface of the N$^+$ silicon substrate 1 and in a vertical direction along its thickness become like those shown in FIGS. 2B and 2C, where the horizontal coordinate of the region irradiated by the ion beam 2 is shown along the X-axis, the vertical coordinate toward the bottom of the N$^+$ silicon substrate along the Z-axis and the boron distribution along the Y-axis.

The region irradiated by a boron-ion beam is set to present a striped shape that has a width of W on the substrate surface and normal to the page surface. The irradiation of the boron beam is performed to electrically sweeping the beam in the vertical and horizontal directions on the irradiated region.

The sweeping can also be performed by a magnetic sweep and movement of the N$^+$ silicon substrate 1.

The control of the boron beam irradiation can also be performed by using a boron-ion beam which is broadened to a flux beam and a striped shape shield mask which is inserted between the boron-ion source and the silicon substrate, with the aperture width W of this shield mask being varied.

Since the projection range of the boron-ion beam 2, ranging from the surface of the N$^+$ silicon substrate, is short in the case of irradiation with low energy, the cross-sectional shape of the boron stopped region 3, which is parallel to planes vertical to the ion incident direction (planes parallel to the surface, if the irradiation is made normal to the surface), becomes almost equal to the shape of the boron-ion irradiated region.

The distribution of boron in the N$^+$ silicon substrate 1 is explained in further detail. As shown in FIG. 2B, the boron distribution shows an almost flat profile along the horizontal direction over the boron-ion irradiated region, accompanied by lateral broadening at the both ends of the irradiated region.

Also as shown in FIG. 2C, a peak in boron concentration appears at a shallow position from the surface of the N$^+$ silicon substrate 1, of which depth is equal to the projection range of boron-ions. The implanted boron receives a heat treatment for activation in the subsequent annealing step, and the boron stopped region 3 turns into a P$^+$ region, as shown by a right-down crosshatch in FIG. 2A.

In FIGS. 3A, 3B, 3C and FIGS. 4A, 4B, 4C, a boron-ion beam of high energy 2 is irradiated onto the surface of the N$^+$ silicon substrate 1. As shown in FIG. 3A, since the projection range of the boron implanted into the N$^+$ silicon substrate 1 is long in the case of a high energy irradiation of boron-ion beam 2, a boron stopped region 3 can be formed near the back surface of the N⁺ silicon substrate 1. In FIGS. 3A, 3B, 3C and 4A, 4B 4C, like numbers refer to like components as in FIGS. 2A, 2B and 2C.

As mentioned before, the boron distribution in the N⁺ silicon substrate 1 has lateral broadening. In order to make the width W of the boron stopped region 3 formed near the back surface in FIG. 3A equal to the width W of the boron stopped region 3 of FIG. 2A, the width W' of the boron irradiation region should be narrower than that of FIG. 2A (W'<W), as indicated by the dashed lines in FIG. 3A.

When a boron stopped region 3 is formed near the back surface of the N⁺ silicon substrate 1 by a high energy irradiation, a peak in boron concentration appears near the back surface, as shown in FIG. 3C. In the regions other than the boron stopped region 3 between the dashed lines in FIG. 3C, accelerated high energy boron-ions simply pass through and almost no boron is doped there. Only the boron stopped region 3, therefore, turns into a P⁺ region, as shown by a right-down crosshatch in FIG. 3A, in the subsequent heat treatment for activation of implanted boron.

While a high energy irradiation, thus, can form a P⁺ region deep in the N⁺ silicon substrate 1, it cannot form a P⁺ region between the surface and the P⁺ boron stopped region 3, because boron is not doped there.

As shown in FIGS. 4A and 4C, in order to form a striped-shape P⁺ boron implanted region 3a having a uniform width W extending from the surface of the N⁺ silicon substrate 1 through its back surface, the acceleration energy of implanted boron-ions should be varied continuously to adjust the projection range of boron-ions in the N⁺ silicon substrate 1 so that a uniform boron distribution may be obtained in the vertical direction.

Namely, since the lateral broadening becomes larger as the projection range becomes larger, the width W' of the boron irradiated region is controlled to be smaller (W'<W) as the acceleration energy is higher and the projection range is deeper, so that the boron concentration and the width W of the boron implanted region 3a may be uniform in a vertical direction, as shown in FIG. 4A.

The boron projection range may be controlled by gradually increasing the acceleration energy to extend from the surface of the N⁺ silicon substrate 1 through its back surface or may be controlled by gradually decreasing the acceleration energy to extend from its back surface to surface. In the subsequent heat treatment for activation of implanted boron, the boron implanted region 3a turns into a P⁺ region, and then a super junction can be formed across the N⁺ silicon substrate 1.

In the above first embodiment of the invention, the boron irradiated region has been formed to present a slit-like shape and its width W' has been controlled. The shape of the irradiated region, however, is not necessary slit-like.

Whatever shape the irradiated area may present, by controlling the irradiated region according to the boron-ion acceleration energy, it is possible to make the boron concentration in the P⁺ boron implanted region 3a uniform along the direction of irradiation and make the cross-sectional shape and the cross-section area of the P⁺ boron implanted area 3a on planes perpendicular to the direction of irradiation uniform along the direction of irradiation.

In this way, any arbitrary shape can be taken as the cross-section of the P⁺ boron implanted region 3a, and thus the application range of super junction to devices can be widened. This is also true for the following embodiments of the invention.

Now referring to FIG. 5, a second embodiment is explained, where a super junction is formed by a boron-ion implantation using a resist mask. In FIG. 5, what denoted as 1 is an N⁺ silicon substrate, 2 a boron-ion beam, 3a a P⁺ boron implanted region and 4 a shield mask made of a photoresist.

First, using a Photo Engraving Process (PEP), a shield mask 4 intercepting boron-ion beam is formed which has opening portions allowing boron-ion irradiation. Onto its opening portions, the boron-ion beam 2 is irradiated with its acceleration energy being varied continuously. Then the boron-ion beam can be irradiated as a whole by the use of a wide flux beam. The boron-ion beam can either be swept electrically or magnetically. Also the sweeping can be performed by moving the N⁺ silicon substrate 1.

As described in the first embodiment, the boron projection range in the N⁺ silicon substrate 1 is controlled to provide a uniform concentration of boron vertically in the P⁺ boron implanted region 3a. Then not only the acceleration energy but also the beam current can be controlled to adjust the dose amount.

The boron acceleration energy and its dose amount are controlled so that the boron-ion projection ranges may overlap each other to provide a uniform boron distribution in the vertical direction in the N⁺ silicon substrate 1. Since the lateral broadening become larger by boron scattering as the projection range becomes deeper, the thickness of the N⁺ silicon substrate 1 should be chosen so that the striped-shape P⁺ boron implanted regions 3a may not overlap each other near the back surface of the substrate.

In the subsequent heat treatment for activation of implanted boron, the boron implanted region 3a, shown by a right-down hatch in FIG. 5, turns into a P⁺ region, and then a super junction is formed across the N⁺ silicon substrate 1.

If an N⁺ region (corresponding to 101 in FIG. 1), which will be a drain region of the low power dissipation semiconductor power device described in FIG. 1, is formed in the back surface of the N⁺ silicon substrate 1 by diffusion or ion implantation, a low power dissipation semiconductor power device with an excellent performance can be yielded, even if the width W of its P⁺ boron implanted region is not uniform in the vertical direction as shown in FIG. 4A.

In the subsequent annealing process conducted after boron-ion implantation, boron presents lateral broadening due to diffusion and as a result P⁺ boron implanted regions 3a further approach each other near the back surface. However, if the N⁺ drain region and the N⁺ region, which is left as a triangle area in the silicon wafer in FIG. 5, are well connected, the performance of the low power dissipation semiconductor power device will not be significantly affected (see the explanation for FIG. 6D).

Figure 6A:
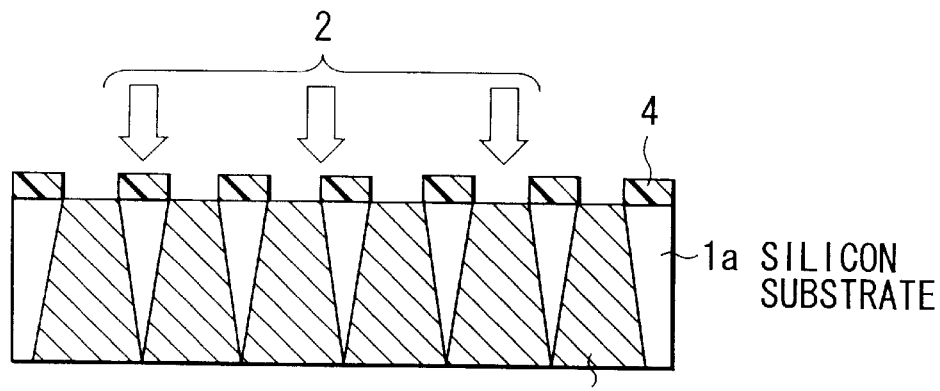
FIGS. 6A–6D show a method of forming a super junction by the use of reversed imaging shield masks according to a third embodiment of the present invention.

Now referring to FIGS. 6A to 6D, a third embodiment of the invention is described, which is a method of forming a super junction by boron and phosphorous implantation using a reversed mask. In FIG. 6A, denoted as 1a is a silicon substrate, 2 a boron-ion beam, 3a a P⁺ boron implanted region, and 4 a shield mask made of a photoresist.

As is the case with the second embodiment of the invention, using a shield mask 4 made of a photoresist, the boron-ion beam 2 is irradiated onto the silicon substrate 1a, with its acceleration energy being continuously varied, as sown in FIG. 6A. A P⁺ boron implanted region 3a shown by a right-down hatch, is thereby formed inside the silicon substrate 1a.

Figure 6B:
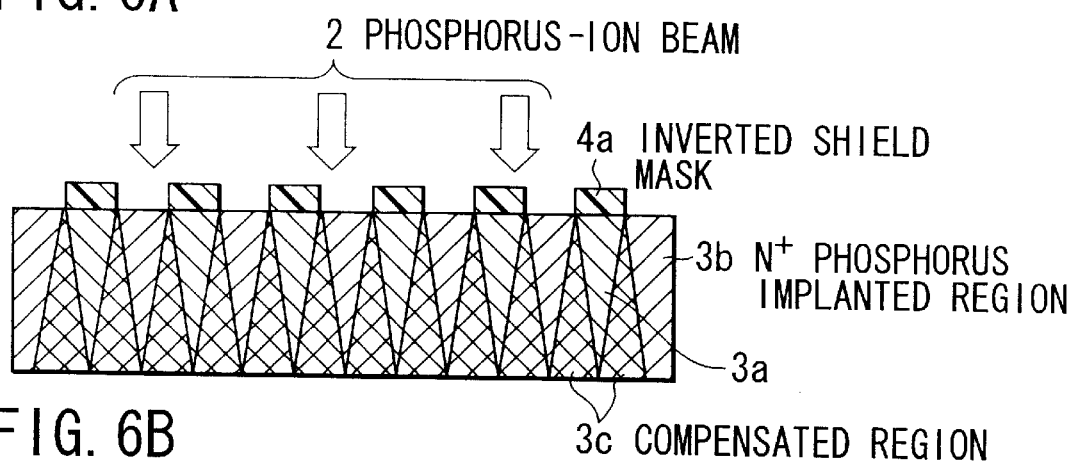

Next, another shield mask 4a made of a photoresist is formed by PEP on the silicon substrate 1a, of which opening portion and shielding portion are reversed each other of the mask 4, as shown in FIG. 6B. This shield mask 4a can be formed on the silicon substrate 1a by preparing a positive and negative image photomasks using the same photoresist or by using positive and negative types of photoresists using the same photomask.

As a next step, a phosphorous-ion beam 2a is irradiated through the opening portion of the inverted shield mask 4a made of the above photoresist, with its acceleration energy being varied continuously, and an $N^+$ phosphorous implanted region 3b is formed as shown by a left-down hatch in FIG. 6B. As the ion projection range becomes deeper, the $P^+$ boron implanted region 3a and the $N^+$ phosphorous implanted region 3b become broader. Then toward the back surface, they come to overlap each other and a compensated region 3c is formed as shown by a crosshatch in FIG. 6B.

By a heat treatment for activation of implanted boron and phosphorous, the boron implanted region 3a and the phosphorous implanted region 3b turn into $P^+$ and $N^+$, respectively. In the compensated region 3c, where the above two regions overlap each other, a $P^+/N^+$ junction plane is formed along the ridge. The boron implanted region becomes a $P^+$ region compensated by phosphorous and the phosphorous region becomes an $N^+$ region compensated by boron.

Figure 6C:
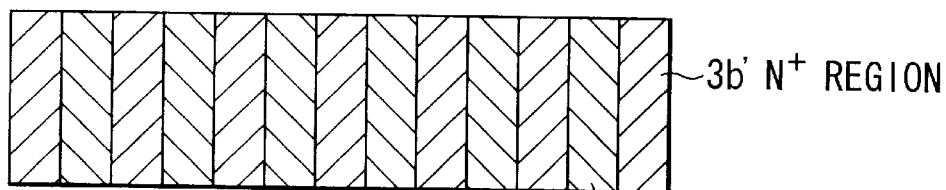

FIG. 6C shows the shape of a super junction formed in the above way. The compensated $P^+$ region 3a' and compensated $N^+$ region 3b' after a heat treatment for activation turn into uniform regions of which width and concentration are constant in the vertical direction.

Figure 6D:
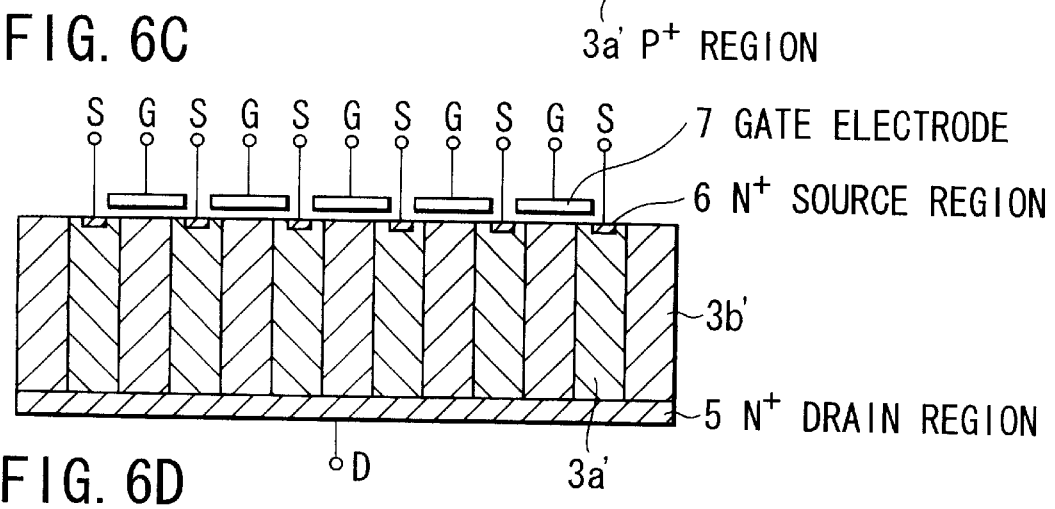

As a next step, phosphorous is diffused or implanted, and an $N^+$ drain region 5 and an $N^+$ source region 6 are formed as shown in FIG. 6D. Further, a gate electrode 7 is formed via a gate insulating film (not shown) so that it may cover the compensated $N^+$ region 3b' connected to the $N^+$ drain region 5 and the compensated $P^+$ region 3a' exposed on the substrate surface. Finally, when the source electrode S and the drain electrode D are formed, the desired low power dissipation semiconductor power device is completed.

In this way, if the surface of compensated $P^+$ region 3a', which is exposed on the surface of silicon substrate 1a, is inverted to a N-type channel, the semiconductor device operates as an NMOS-type device. In other words, the low power dissipation semiconductor power device in FIG. 6D has a small ON resistance because it has a drain junction plane, to which high voltages are applied, made of a super junction consisting of the $P^+$ region 3a' and $N^+$ region 3b' which extend in a direction perpendicular to the wafer surface.

Further, since the drain depletion region extends to $N^+$ drain region 5 through $N^+$ region 3b' along the super junction, this NMOS-type low power dissipation semiconductor power device has a large withstand voltage. It is also obvious that if the above $N^+$ regions are replaced by $P^+$ regions a PMOS-type low power dissipation semiconductor power device is obtained.

Figure 7:
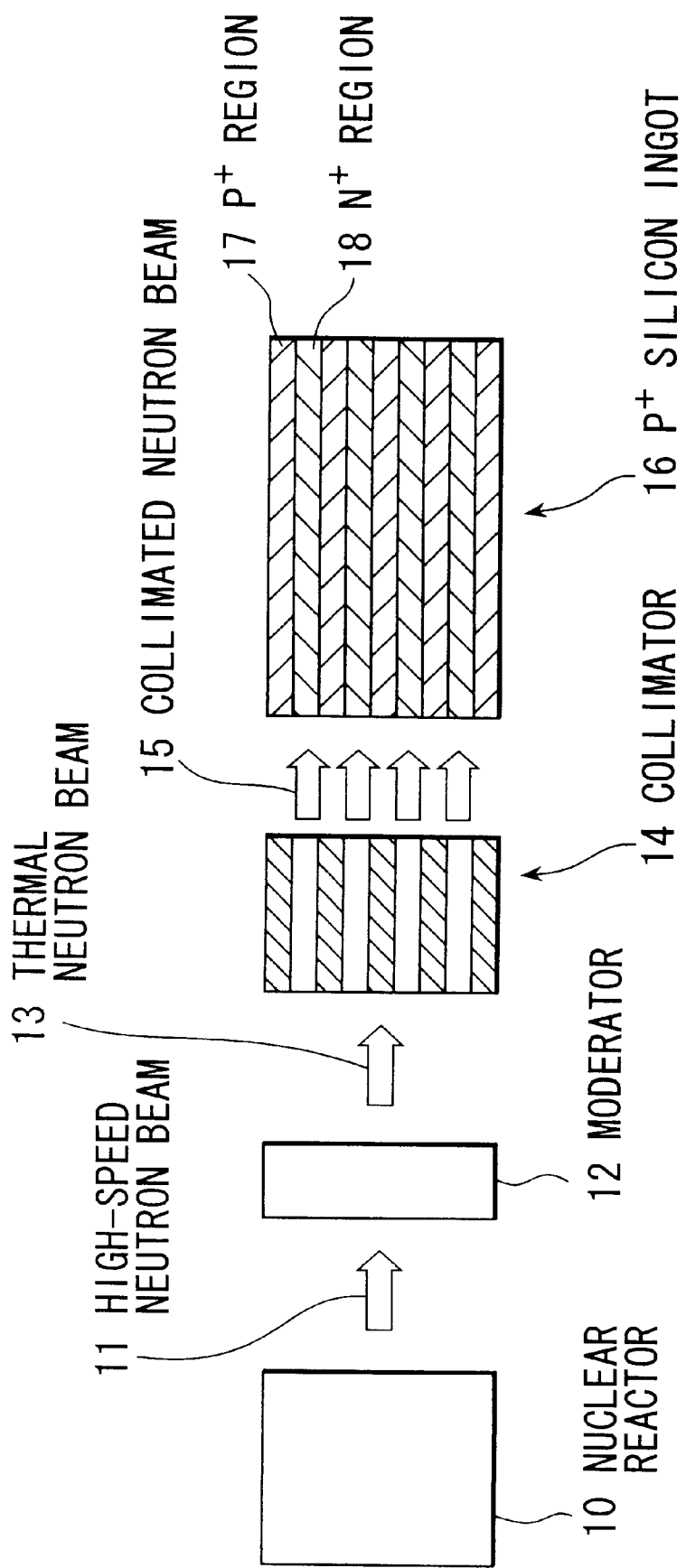
FIG. 7 shows a method of forming a super junction by a neutron beam irradiation according to a forth embodiment of the present invention.

Now referring to FIG. 7, a forth embodiment of the invention is explained. The forth embodiment describes a method of forming a super junction in which a $P^+$ silicon ingot is irradiated by a neutron beam through a collimator made of lead to transmute silicon atoms into phosphorous atoms by a nuclear reaction.

In FIG. 7, denoted as 10 is a nuclear reactor, 11 a high-speed neutron beam, 12 a moderator (water) for the high-speed neutron beam, 13 a thermal neutron beam after passing through the moderator, 14 a lead collimator, 15 a collimated neutron beam, and 16 a $P^+$ silicon ingot.

By the neutron beam irradiation shown in FIG. 7, a super junction structure is formed in which a $P^+$ region 17 (part of the $P^+$ silicon ingot) and an $N^+$ region 18 are alternatively piled up. The $P^+$ silicon ingot 16 is placed as its direction of growth axis becomes parallel with the neutron beam irradiation direction. The collimated neutron beam 15, which has been collimated via the collimator 14, is irradiated to transmute part of silicon atoms into phosphorous atoms by a nuclear reaction.

The high-speed neutron beam 11 turns into the low energy thermal neutron beam 13, passing through the moderator 12 (water) to raise the collision cross section during nuclear reaction.

Stripes of $N^+$ regions 18 are formed by the collimated neutron beam 15, which is made by passing the thermal neutron beam 13 through the collimator 14 where stripes of lead layers are mounted that completely absorb neutrons. Then the thickness of each lead layer is determined, so that neutrons are absorbed sufficiently, the neutron beams become parallel to each other in the $P^+$ silicon ingot 16, and the widths of formed $N^+$ regions 18 become uniform.

Since neutron beams have a high transmission coefficient and a small broadening, they are capable of forming $N^+$ regions 18 of a uniform width over the $P^+$ silicon ingot 16. If this wafer is sliced in the direction vertical to the irradiation direction (namely, the growth axis of ingot), many silicon substrates each having a super junction formed to the direction vertical to surface are provided at a time.

Having described the principles of the invention in preferred embodiments, it is appreciated that the invention can be modified in arrangement and detail without departing from such principles. For example, although boron has been implanted as a $P^+$ impurity in an $N^+$ silicon substrate in the first and second embodiments of the invention, a silicon substrate is also obtained that has an $N^+$ region as super junction if a silicon substrate having an $N^+$ region is employed.

It is obvious that a similar super junction can be formed by implanting a second and first conductivity-type impurities into a first and second conductivity-type silicon substrates, respectively.

Likewise, in the forth embodiment of the invention, if the $P^+$ silicon ingot is replaced by a silicon ingot having a $P^+$ region, a silicon ingot is obtained that has the $P^+$ region as a super junction.

Although the direction of neutron beam irradiation has been parallel to the growth axis of the silicon ingot, a super junction can be formed in any silicon ingot having a $P^+$ region by irradiating a collimated neutron beam from any direction.

In the forth embodiment of the invention, a neutron beam has been irradiated onto a $P^+$ silicon ingot. However, the ingot is not necessarily made of silicon. The present invention allows the use of semiconductor ingots made of group IV elements such as germanium and silicon carbide. The present invention can be modified in arrangement and detail without departing from its principles.

As described above, by the method of forming a super junction according to the present invention, which does not use conventional complex processes like the epitaxial growth but use only efficient processes such as ion implantation and neutron beam irradiation, a super junction can be formed that has an arbitrary and uniform cross-section in the vertical direction. Specifically, the ion implantation and the neutron beam irradiation have the following advantages:

(1) Since a selective irradiation can be performed by an electric or magnetic sweep or movement of silicon substrate, the width of irradiation pattern can be continuously controlled according to changes in ion acceleration energy, and the vertical distribution of implanted ions shows an excellent uniformity.

(2) A second conductivity-type region is formed by changing only the acceleration energy after a first conductivity-type region is formed on a silicon substrate using a shield mask made of a photoresist having stripes of openings with a predetermined aperture width. Then although the vertical distribution of ions becomes relatively less uniform, a super junction can be formed using only the common ion implantation equipment and PEP without conducting ion beam sweep.

(3) If a first and second conductivity-type regions are formed by ion irradiation onto an intrinsic silicon substrate by the use of a shield mask made of a photoresist with striped shape openings of a specific width and another shield mask made of a photoresist in the reversed relation to the above photoresist, a uniform super junction is formed in the vertical direction because the lateral broadenings of ions compensate each other due to scattering.

(4) If a collimated neutron beam is irradiated onto a $P^+$ silicon ingot, a uniform super junction is formed there, because the transmission coefficient of neutron beam is high enough to precisely transmute the irradiated region into an $N^+$ region with less broadening. If the neutron beam is irradiated in parallel with the growth axis of the silicon ingot and silicon wafers are sliced out in the direction vertical to the growth axis as is the case with common silicon wafers, many silicon substrates each having a precision super junction over its surface can be produced at a time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method of forming a second conductivity-type region by irradiating impurity ions onto a first conductivity-type semiconductor substrate;
   wherein the impurity ion irradiated region is restricted by a shield mask intercepting said impurity ions and the impurity ion acceleration energy is controlled to provide a uniform impurity distribution in the direction of irradiation in said second conductivity-type region.

2. A semiconductor device manufacturing method of forming at least one of a first and second conductivity-type regions in a semiconductor substrate by selectively irradiating impurity ions onto said semiconductor substrate;
   wherein the impurity distributions in said first and second conductivity-type regions are uniform in the direction of irradiation, and the impurity ion acceleration energy and the area of each region irradiated by said impurity ions are controlled so that the cross-sectional shape and cross-section area of said first and second conductivity-type regions on planes perpendicular to the direction of irradiation may be uniform in the direction of irradiation.

3. The semiconductor device manufacturing method according to claim 2, wherein the control of the area of said irradiated region comprises the steps of forming an ion beam made of impurity ions and sweeping the ion beam in the vertical and horizontal directions on the irradiated region, and the acceleration energy and the area of the irradiated region are controlled by changing the area of said irradiated region according to changes in said acceleration energy.

4. The semiconductor device manufacturing method according to claim 3, wherein said impurity ion beam is electrically swept on the irradiated region.

5. The semiconductor device manufacturing method according to claim 3, wherein said impurity ion beam is magnetically swept on the irradiated region.

6. The semiconductor device manufacturing method according to claim 3, wherein said impurity ion beam is swept on the irradiated region by moving the semiconductor substrate.

7. The semiconductor device manufacturing method according to claim 3, wherein the acceleration energy and the area of the irradiated region are controlled by decreasing the area of the irradiated region according to increase in the acceleration energy.

8. The semiconductor device manufacturing method according to claim 3, wherein the acceleration energy and the area of the irradiated region are controlled by increasing the area of the irradiated region according to decrease in the acceleration energy.

9. The semiconductor device manufacturing method according to claim 2, wherein the area of the irradiated region is restricted by a shield mask intercepting said impurity ions, and the acceleration energy and the area of the irradiated region are controlled by changing the area of each opening of said shield mask intercepting impurity ions according to changes in the acceleration energy.

10. The semiconductor device manufacturing method according to claim 9, wherein the acceleration energy and the area of the irradiated region are controlled by decreasing the area of each opening of said shield mask intercepting impurity ions according to increase in the acceleration energy.

11. The semiconductor device manufacturing method according to claim 9, wherein the acceleration energy and the area of the irradiated region are controlled by increasing the area of each opening of said shield mask intercepting impurity ions according to decrease in the acceleration energy.

12. A semiconductor device manufacturing method of forming a first conductivity-type region and a second conductivity-type region on a semiconductor substrate by irradiating impurity ions onto said semiconductor substrate;
    wherein the regions irradiated by impurity ions are restricted by impurity ion intercepting shield masks which are in an inverted imaging relation to each other so that the cross-sectional shape and the cross-section area of the first and second conductivity-type regions on planes perpendicular to the direction of irradiation may be uniform along the direction of irradiation, and the impurity ion acceleration energy is controlled to make the impurity ion distributions in the first and second conductivity-type regions uniform along the direction of irradiation.

13. The semiconductor device manufacturing method according to claim 12, wherein said impurity ion intercepting shield masks which are in an inverted imaging relation to each other are formed by printing the same mask patterns on the semiconductor substrate by the use of a positive resist and a negative resist.

14. A semiconductor device manufacturing method of forming an $N^+$ region by irradiating a neutron beam onto a semiconductor ingot having a $P^+$ region;

wherein the incident direction of said neutron beam is collimated to make the cross-sectional shape and the cross-section area of said N$^+$ region on planes perpendicular to the direction of irradiation uniform along the direction of irradiation, and the impurity distribution in said N$^+$ region is controlled to be uniform along the direction of irradiation.

15. The semiconductor device manufacturing method according to claim 14, wherein the semiconductor having the P$^+$ region is an P$^+$ type semiconductor ingot and the incident direction of said neutron beam is parallel to the growth axis of said P$^+$ type semiconductor ingot.

16. The semiconductor device manufacturing method according to claim 14, wherein said semiconductor ingot is made of silicon.

17. The semiconductor device manufacturing method according to claim 14, wherein said semiconductor ingot is made of germanium.

18. The semiconductor device manufacturing method according to claim 14, wherein said semiconductor ingot is made of silicon carbide.

* * * * *